United States Patent
Fujiwara et al.

(10) Patent No.: US 12,492,079 B2
(45) Date of Patent: Dec. 9, 2025

(54) CONVEYANCE DEVICE

(71) Applicant: DAIFUKU CO., LTD., Osaka (JP)

(72) Inventors: Yosuke Fujiwara, Komaki (JP); Kengo Ikedo, Komaki (JP); Keita Yamada, Komaki (JP); Tsubasa Yajima, Komaki (JP); Yuta Mani, Komaki (JP); Hiroyoshi Toba, Komaki (JP); Keisuke Shiroishi, Gamo-gun (JP); Kenshin Hashiguchi, Gamo-gun (JP); Masashi Kakuma, Gamo-gun (JP); Junichi Sakamoto, Gamo-gun (JP); Kazuya Namazue, Gamo-gun (JP); Naoya Toyoshima, Gamo-gun (JP); Kazuhiro Hayami, Gamo-gun (JP); Kenji Tamura, Gamo-gun (JP)

(73) Assignee: Daifuku Co., Ltd., Osaka (JP)

( * ) Notice: Subject to any disclaimer, the term of this patent is extended or adjusted under 35 U.S.C. 154(b) by 292 days.

(21) Appl. No.: 18/345,138

(22) Filed: Jun. 30, 2023

(65) Prior Publication Data
US 2024/0017929 A1 Jan. 18, 2024

(30) Foreign Application Priority Data

Jul. 12, 2022 (JP) ................. 2022-111852

(51) Int. Cl.
*B65G 17/00* (2006.01)
*B65G 17/20* (2006.01)

(52) U.S. Cl.
CPC ................. *B65G 17/20* (2013.01)

(58) Field of Classification Search
CPC ......... H01L 21/67736; H01L 21/67733; H01L 21/677; B65G 47/907; G02F 1/1303; B66C 1/28; B66C 1/30; B66C 1/425; B66C 1/62; B66C 9/02; B66C 13/08; B66C 13/14; B66C 13/22
See application file for complete search history.

(56) References Cited

U.S. PATENT DOCUMENTS

2016/0280460 A1 9/2016 Porat
2017/0323817 A1 11/2017 Kobayashi

FOREIGN PATENT DOCUMENTS

| JP | H05-319696 A | 12/1993 |
| JP | 2000-100718 A | 4/2000 |
| JP | 200522539 A | 1/2005 |
| JP | 2005-294280 A | 10/2005 |

(Continued)

OTHER PUBLICATIONS

Japanese Office Action for Japanese Patent Application No. 2022-111852 issued on Jul. 15, 2025 and English machine translation thereof.

(Continued)

*Primary Examiner* — Emmanuel M Marcelo
(74) *Attorney, Agent, or Firm* — Harness, Dickey & Pierce, P.L.C.

(57) ABSTRACT

A size of a conveyance device is reduced. A conveyance device includes: a carriage configured to travel along a track; and a transfer mechanism hung from the carriage so as to be capable of being raised and lowered. The transfer mechanism includes a plurality of chucks each of which is configured to revolve about a rotation center provided in the transfer mechanism.

6 Claims, 6 Drawing Sheets

(56) References Cited

FOREIGN PATENT DOCUMENTS

| | | | |
|---|---|---|---|
| JP | 2010132404 A * | 6/2010 | ....... H01L 21/67724 |
| JP | 2017-202885 A | 11/2017 | |
| JP | 2018-509357 A | 4/2018 | |
| JP | WO2018037762 A1 * | 6/2019 | ......... H01L 21/6773 |
| WO | WO-2006104115 A1 * | 10/2006 | ....... H01L 21/68707 |
| WO | WO-2018003287 A1 * | 1/2018 | ....... H01L 21/67715 |
| WO | WO-2018207462 A1 * | 11/2018 | ........... H01L 21/681 |
| WO | WO-2019035286 A1 * | 2/2019 | ............... B65G 1/04 |
| WO | WO-2020153039 A1 * | 7/2020 | ....... H01L 21/67733 |

OTHER PUBLICATIONS

Office Action dated Oct. 28, 2025 issued in Japanese patent application No. 2022-111852.

* cited by examiner

CONVEYANCE DEVICE

This Nonprovisional application claims priority under 35 U.S.C. § 119 on Patent Application No. 2022-111852 filed in Japan on Jul. 12, 2022, the entire contents of which are hereby incorporated by reference.

TECHNICAL FIELD

The present invention relates to a conveyance device.

BACKGROUND ART

A conveyance device, such as an over head hoist transport (OHT) and an over head shuttle (OHS), has been suitably used in the fields of semiconductor manufacture, a liquid crystal manufacture, and the like as a device for conveying a conveyance target to a predetermined place with use of a carriage that travels on a track. For example, Patent Literature 1 discloses an OHT conveying carriage that includes two finger mechanisms for gripping respective two carriers each of which is configured to accommodate wafers and that can individually load and unload the carriers.

CITATION LIST

Patent Literature

[Patent Literature 1]
Japanese Patent Application Publication Tokukai No. 2005-22539

SUMMARY OF INVENTION

Technical Problem

The above-described OHT conveying carriage has the two carriers which are disposed so as to be horizontally arranged side by side. Thus, the OHT conveying carriage is increased in size and occupies a lot of space particularly in a conveyance direction. This decreases the number of the OHT conveying carriages that can be disposed in proximity to each other in a conveyance direction. Therefore, conveyance efficiency is unfortunately decreased, and the conveyance device is desired to be reduced in size.

It is an object of an aspect of the present invention to reduce a size of a conveyance device.

Solution to Problem

In order to solve the foregoing problem, a conveyance device in accordance with an aspect of the present invention includes: a carriage configured to travel along a track; and a transfer section hung from the carriage so as to be capable of being raised and lowered, the transfer section including a plurality of gripping parts each of which is configured to revolve about a rotation center provided in the transfer section.

Advantageous Effects of Invention

According to an aspect of the present invention, it is possible to reduce a size of a conveyance device.

DESCRIPTION OF EMBODIMENTS

[Configuration of Transfer System]

Figure 1:
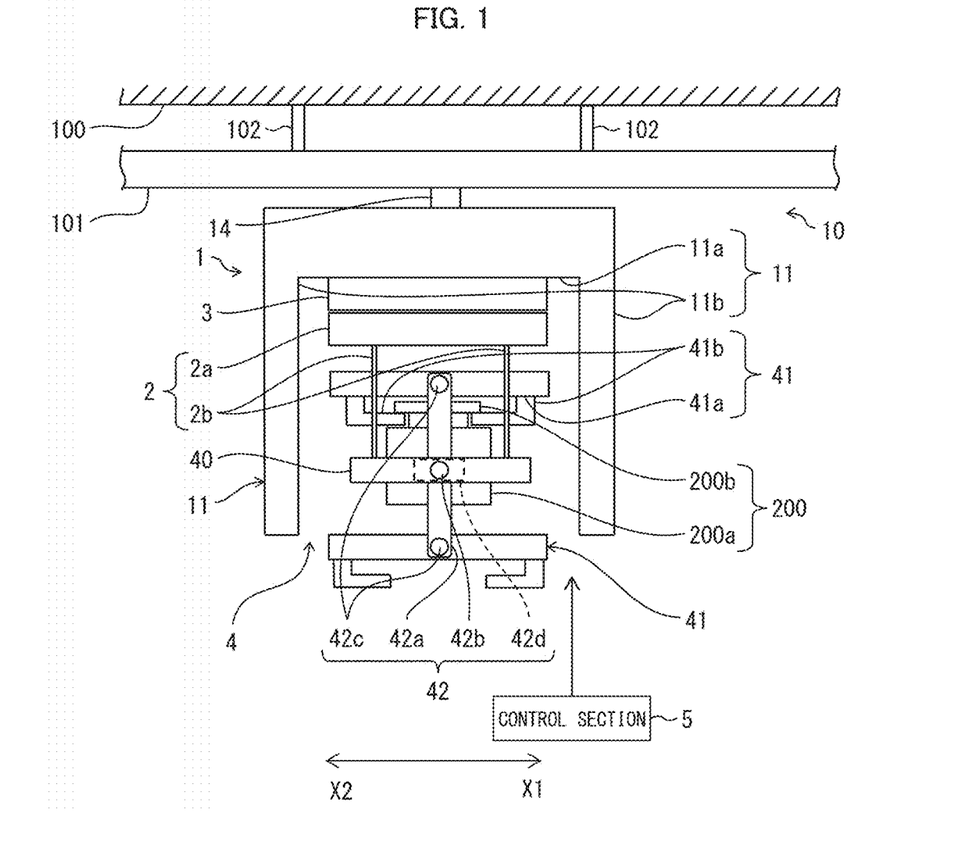
FIG. 1 is a front view illustrating a configuration of a transfer system including a conveyance device in accordance with an embodiment of the present invention.
Figure 2:
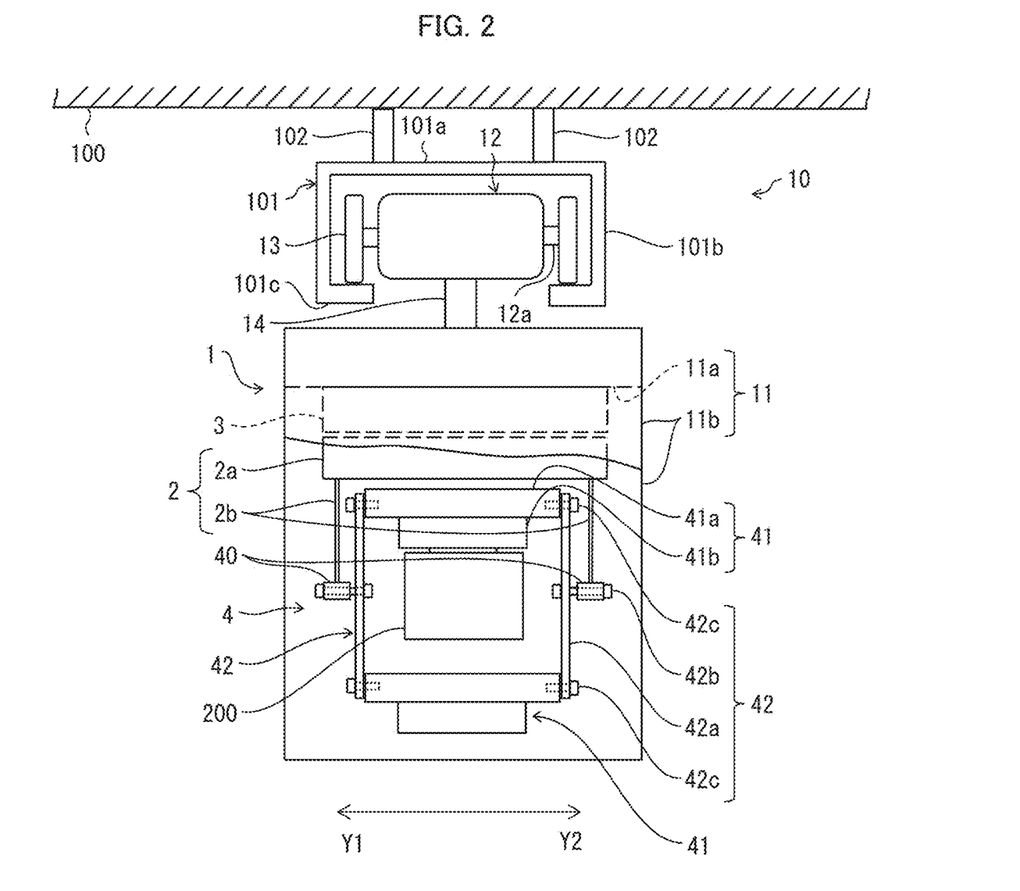
FIG. 2 is a side view illustrating a configuration of the transfer system.
Figure 3:
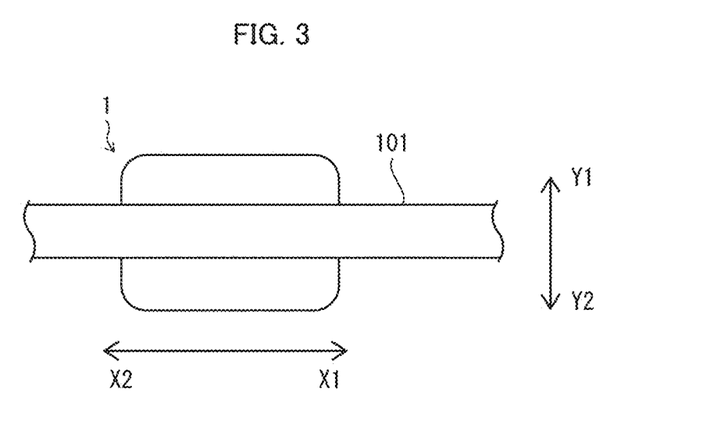
FIG. 3 is a top view illustrating a configuration of the transfer system as seen from a ceiling side.

With reference to FIGS. 1 to 3, the following will describe a transfer system in which a conveyance device in accordance with an embodiment of the present invention is used. FIG. 1 is a front view illustrating the transfer system. FIG. 2 is a side view illustrating a configuration of the transfer system. FIG. 3 is a top view illustrating a configuration of the transfer system as seen from a ceiling 100 side.

As illustrated in FIGS. 1 to 3, the transfer system is provided so as to be hung from a ceiling 100. The transfer system includes a conveyance device 10, a track 101, and hanging metal fittings 102.

The track 101 is disposed on a moving path of the conveyance device 10 and is supported so as to be hung from the ceiling 100 with use of the plurality of hanging metal fittings 102. The track 101 has an upper surface portion 101a, a pair of side portions 101b, and a pair of lower surface portions 101c. The upper surface portion 101a is a portion attached to the hanging metal fittings 102 and is disposed so as to face the ceiling 100. Each of the side portions 101b is a side wall portion disposed so as to hang down from each of both side edges of the upper surface portion 101a. Each of the lower surface portions 101c is formed so as to be short and so as to extend from a lower edge of one side portion 101b to an inner wall surface side of the other side portion 101b. Each of the lower surface portions 101c forms a track surface on which each of wheels 13 (described later) which is provided at a carriage 1 rolls.

The conveyance device 10 conveys a container 200 (a conveyance target) to a destination by travelling along the track 101 in a conveyance direction (an X1 direction or an X2 direction opposite to the X1 direction) in a state in which the conveyance device 10 is hung from the track 101. The container 200 includes an accommodating part 200a. The accommodating part 200a accommodates, for example, articles, such as a wafer and a reticle, that are used for manufacture of semiconductors. On the upper end surface of the accommodating part 200a, a flange portion 200b is provided.

[Configuration of Conveyance Device]

The conveyance device 10 includes the carriage 1, a raising and lowering mechanism 2, a horizontal movement mechanism 3, a transfer mechanism 4 (transfer section), and a control section 5.

The carriage 1 is a travel mechanism that travels along the track 101. The carriage 1 includes a frame 11, a driving section 12, wheels 13, and a support member 14.

The frame 11 is a structure for accommodating the raising and lowering mechanism 2, the horizontal movement mechanism 3, and the transfer mechanism 4 while the carriage 1 travels. The frame 11 has an upper portion 11a and a pair of hanging-down portions 11b. The upper portion 11a is a plate-shaped portion disposed in a horizontal direction. The hanging-down portions 11b are plate-shaped portions that are provided so as to hang down from respective edges of the upper portion 11a on two sides of the upper portion 11a which are located opposite to each other in a conveyance direction. The pair of hanging-down portions 11b are disposed so as to face each other and be parallel to each other. The frame 11 has side portions and a lower portion that are open so as to allow the raising and lowering of the container 200 and the movement of the transfer mechanism 4 in an orthogonal direction (a Y1 direction or a Y2 direction opposite to the Y1 direction) which is orthogonal to the conveyance direction in a horizontal plane.

The driving section 12 generates power for driving the wheels 13, and is constituted by a motor and the like. The driving section 12 includes a driving shaft 12a. The driving shaft 12a is provided so as to protrude toward the wheels 13 and is directly connected with an axle of the wheels 13. The wheels 13 are disposed at positions at which the wheels 13 roll on respective upper end surfaces of the lower surface portions 101c.

The support member 14 is a member for supporting the frame 11 so as to hang the frame 11 from the driving section 12. The support member 14 is provided so as to connect a lower end surface of the driving section 12 and an upper end surface of the upper portion 11a of the frame 11.

The raising and lowering mechanism 2 is a mechanism for raising and lowering the transfer mechanism 4. The raising and lowering mechanism 2 includes a raising and lowering device 2a and a plurality of raising and lowering belts 2b.

The raising and lowering device 2a is a device for rolling up or down the raising and lowering belts 2b with use of a rotation driving force generated by a motor. The raising and lowering device 2a rolls up the raising and lowering belts 2b to raise the transfer mechanism 4 and rolls down the raising and lowering belts 2b to lower the transfer mechanism 4. The raising and lowering belts 2b are provided, for example, at respective four corners of the raising and lowering device 2a, that is, the four raising and lowering belts 2b in total are provided.

The horizontal movement mechanism 3 is a mechanism for causing the raising and lowering device 2a to move in the orthogonal direction (horizontally). The horizontal movement mechanism 3 will be described later.

The transfer mechanism 4 is a mechanism for transferring the container 200 by picking up the container 200 that is placed on a port 301 (see FIG. 4) which is a destination and will be described later so that the container 200 is conveyed with use of the carriage 1, and then placing, onto the port 301, the container 200 that has been conveyed with use of the carriage 1. The transfer mechanism 4 is hung from the frame 11 by the raising and lowering mechanism 2 so as to be capable of being raised and lowered. The transfer mechanism 4 includes supports 40 (support part), two chucks 41 (gripping parts), and a rotation mechanism 42.

The supports 40 are bar-shaped members and are disposed so as to each have a longitudinal direction that coincides with the X1 direction and the X2 direction and so as to be parallel to each other at the same height and at a certain interval. An end portion of each of the raising and lowering belts 2b is fixed to a vicinity of each of both ends of each of the supports 40. In this manner, each of the supports is hung from the raising and lowering device 2a by the two raising and lowering belts 2b.

As described later, the supports 40 are provided with respective support shafts 42b supporting rotation arms 42a. At least part of the interior of each of the supports 40 is provided with a hollow for accommodating a driving device 42d described later.

The chucks 41 are mechanisms for holding the container 200. The chucks 41 revolve about a rotation center provided in the transfer mechanism 4. Each of the chucks 41 includes a main body 41a and a pair of gripping claws 41b. The main body 41a supports the gripping claws 41b and is provided therein with a driving mechanism for driving the gripping claws 41b to open and close in an X1 direction and an X2 direction. The pair of gripping claws 41b have respective tip portions facing each other. When the pair of gripping claws 41b are in a gripping position at which a distance between the tip portions of the pair of gripping claws 41b is the smallest, the tip portions of the pair of gripping claws 41b support a lower surface side of the flange portion 200b of the container 200. When the pair of gripping claws 41b are in an opening position at which the distance between the tip portions of the pair of gripping claws 41b is the largest, the distance between the tip portions of the pair of gripping claws 41b becomes larger than a width of the flange portion 200b.

The rotation mechanism 42 is a mechanism for causing the chucks 41 to rotate in a manner such that the chucks 41 revolve about the rotation center in the orthogonal direction. The rotation mechanism 42 includes a pair of rotation arms 42a (arm part), a pair of support shafts 42b, a plurality of support pins 42c, and the driving devices 42d.

Each of the rotation arms 42a is an elongated plate member having a strip shape. Each of the rotation arms 42a has two end portions which are connected with the corresponding chucks 41. Further, the rotation arms 42a rotatably support the corresponding main bodies 41a of the chucks 41. In a state in which the frame 11 accommodates the rotation mechanism 42, each of the rotation arms 42a is stationary in a position facing in an up-and-down direction, as illustrated in FIG. 1. This causes the two chucks 41 supported by the rotation arms 42a to be disposed so as to be arranged one above the other.

Each of the support shafts 42b is a shaft supporting a corresponding one of the rotation arms 42a so as to drive the corresponding one of the rotation arms 42a to rotate and constitutes the rotation center of the corresponding one of the rotation arms 42a. Each of the support shafts 42b is disposed so as to extend in a Y1 direction and a Y2 direction and so as to face in an orthogonal direction, that is, a direction which is, in a horizontal plane, orthogonal to a travel direction (that is the same direction as the conveyance direction) in which the carriage 1 travels. Each of the support shafts 42b is fixed, at one end part thereof, to a center portion of a corresponding one of the rotation arms 42a. Further, each of the support shafts 42b penetrates through the interior of a corresponding one of the supports 40, and each of the support shafts 42b is exposed, at the other end part thereof, from a side surface of the corresponding one of the supports 40.

The support pins 42c are pins which allow the corresponding rotation arms 42a to rotatably support the corresponding main bodies 41a of the chucks 41. The support pins 42c are disposed so as to extend in a Y1 direction and a Y2 direction. Each of the support pins 42c has a shaft portion and a head portion which has a diameter larger than that of the shaft portion. The shaft portion of each of the support pins 42c penetrates through a hole provided at the end portion of the corresponding one of the rotation arms 42a, and each of the support pins 42c is fixed, in a portion extending from a tip to a middle section, by being embedded into a corresponding one of the main bodies 41a at a center portion of a side surface of the corresponding one of the main bodies 41a. The head portion of each of the support pins 42c holds the corresponding one of the rotation arms 42a so as to prevent the corresponding one of the rotation arms 42a from escaping from the corresponding one of the support pins 42c.

The driving devices 42d are built into the corresponding supports 40 as described above and drive the corresponding support shafts 42b to rotate. The driving devices 42d provided in the corresponding two supports 40 are controlled to operate in the same rotating direction and at the same rotating speed.

The rotation arms 42a rotate about the corresponding support shafts 42b which are rotated by the rotation driving force generated by the corresponding driving devices 42d. Further, each of the rotation arms 42a has, in the end portions thereof, the holes with a diameter larger than that of the shaft portion of the corresponding one of the support pins 42c. This allows the rotation mechanism 42 to cause the rotation arms 42a to support the corresponding chucks 41 so that the chucks 41 freely rotate about the corresponding support pins 42c. Therefore, the weight of the container 200 is applied to the chuck 41 in a state in which the chuck 41 grips the container 200, so that the center of gravity moves downward. This allows the container 200 to be always kept horizontal with respect to the conveyance direction in a rotating state and a non-rotating state.

Further, each of the support shafts 42b may have a rotary dumper incorporated thereinto. This dampens vibration caused by an inertial force that is exerted on a point mass of each of the chucks 41 when the rotation of the chucks 41 is started and when the rotation of the chucks 41 is stopped. As a result, an impact of the vibration on the container 200 can be reduced.

Alternatively, a rotation driving force generated by each of the support shafts 42b may be transmitted to the main bodies 41a of the chucks 41 through a corresponding one of bevel gear structures, so that the chucks 41 always face downward. Specifically, each of the bevel gear structures which are not illustrated includes a first bevel gear, a pair of second bevel gears, and a pair of gear shafts each having two ends each of which has a bevel gear.

The first bevel gear is provided so as to have the same central axis as that of the support shaft 42b and is fixed, for example, to an inner side of the rotation arm 42a in a state in which the first bevel gear is separated from the support shaft 42b so that the first bevel gear does not freely rotate. Each of the second bevel gears is provided so as to have the same central axis as that of the corresponding one of the support pins 42c and is formed, for example, around the shaft portion of the corresponding one of the support pins 42c. Thus, provided between the main bodies 41a of the chucks 41 and the inner side of the rotation arm 42a are spaces in which the corresponding second bevel gears are to be disposed. In addition, the pair of gear shafts are supported on the respective inner sides of the rotation arms 42a so that the pair of gear shafts each can rotate about an axial center thereof. The bevel gear provided on a first end side (support shaft 42b side) of each of gear shafts meshes with the first bevel gear, and the bevel gear provided on the second end side (chuck 41 side) of each of the gear shafts meshes with the corresponding one of the second bevel gears.

In each of the bevel gear structures configured in this manner, when the rotation arm 42a rotates, the bevel gears provided on the first end sides of the gear shafts rotate while meshing with the first bevel gear, so that the gear shafts each rotate about the axial center thereof. As a result, rotation driving forces of the gear shafts are transmitted to the corresponding second bevel gears meshing with the bevel gears provided on the second sides of the gear shafts. Thus, the second bevel gears rotate in a direction opposite to that of the rotation of the first bevel gear and at the same degree as that at which the rotation arm 42a has rotated. Therefore, the transfer mechanism 4 rotates in a direction opposite to that of the rotation of the rotation arms 42a and at the same degree as that at which the rotation arms 42a have rotated. This allows the chucks 41 to always keep facing downward even when the rotation arms 42a rotate.

The control section 5 controls operations of the raising and lowering mechanism 2, the horizontal movement mechanism 3, the transfer mechanism 4, and the driving section 12 in cooperation with a control device (not illustrated) which manages the entire transfer system. Specifically, in a case where the carriage 1 is to be caused to travel, the control section 5 causes the driving section 12 to operate. In addition, in a case where the container 200 is to be caused to be transferred, the control section 5 controls the operation of the raising and lowering mechanism 2 and, as necessary, the operation of the horizontal movement mechanism 3, and controls the operations of the chucks 41 and the driving devices 42d in the transfer mechanism 4.

[Operation of Conveyance Device]

Figure 4:
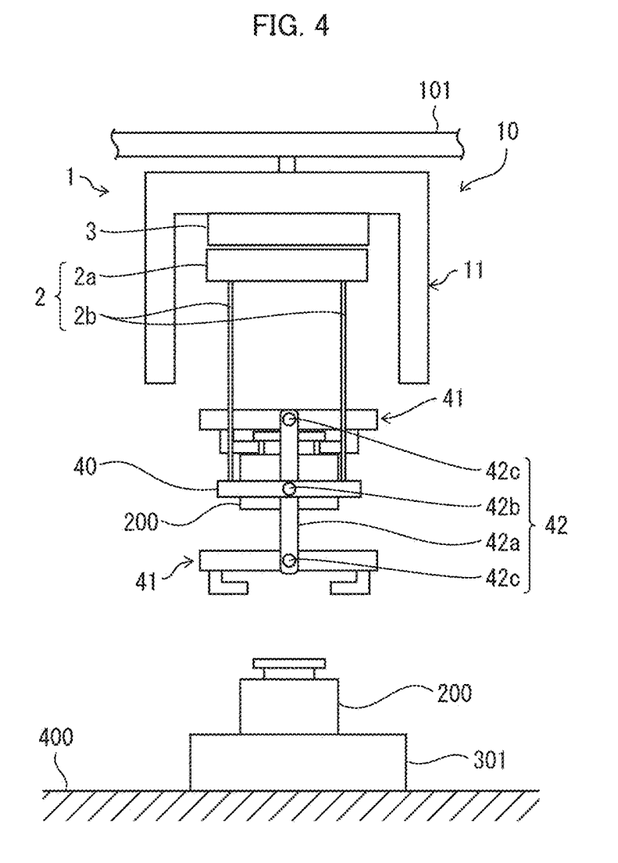
FIG. 4 is a front view illustrating the conveyance device in a state in which a transfer mechanism is being lowered during transfer.
Figure 5:
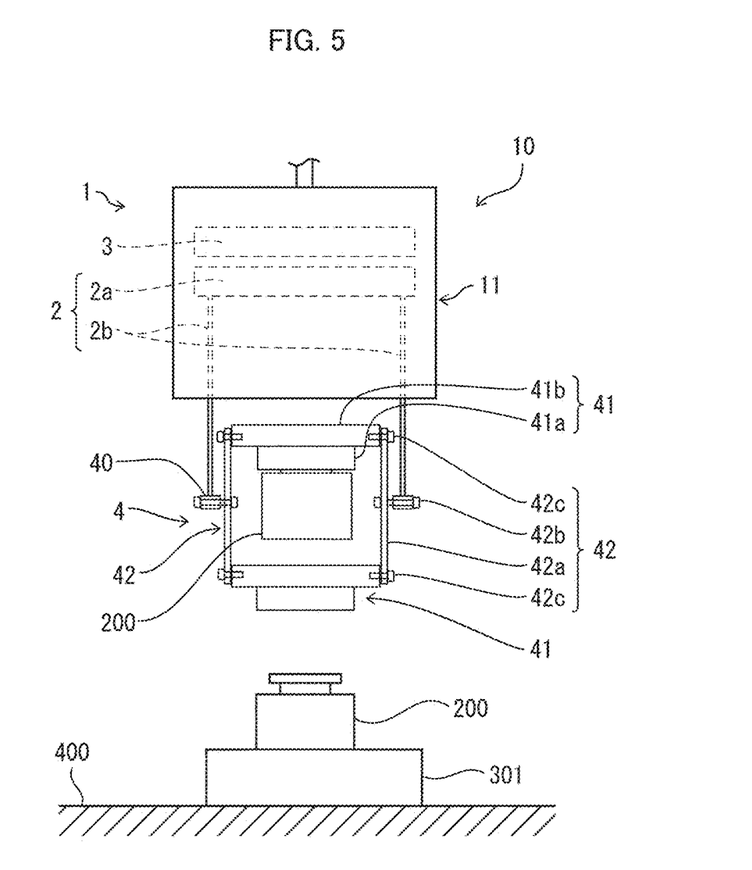
FIG. 5 is a side view illustrating the conveyance device in a state in which the transfer mechanism is being lowered during transfer.
Figure 6:
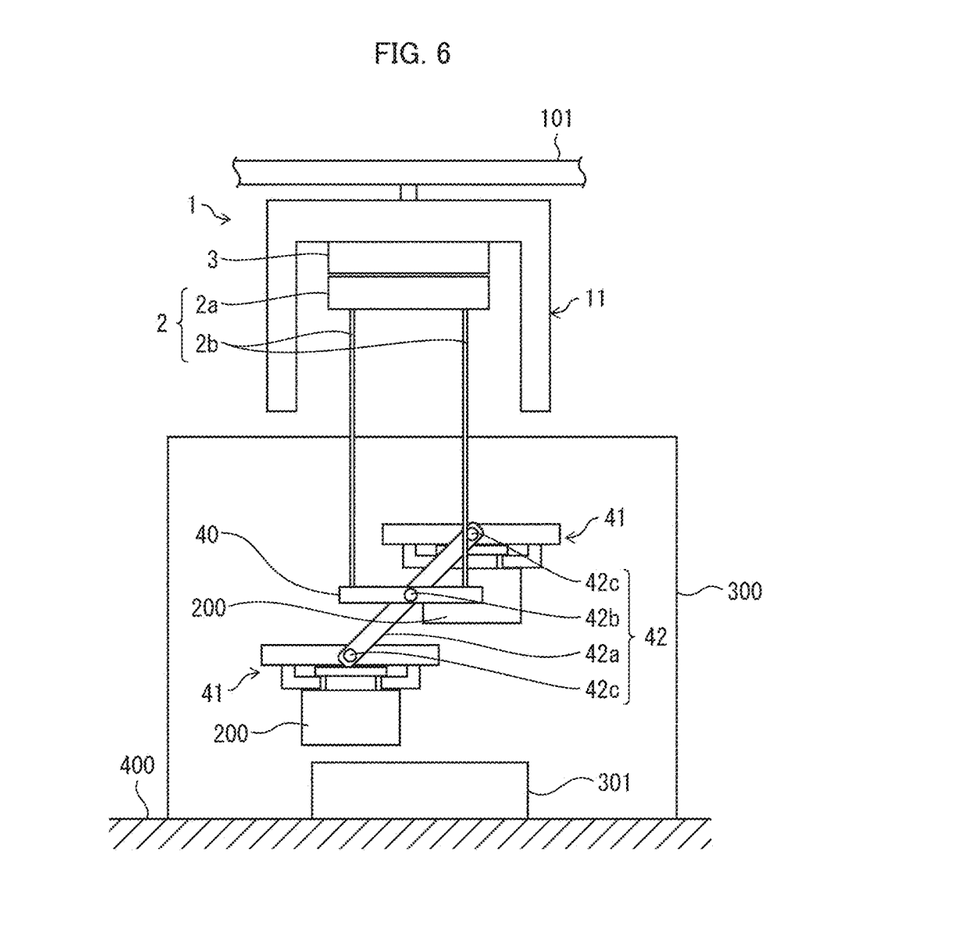
FIG. 6 is a front view illustrating the conveyance device in a state in which the transfer mechanism is rotating during transfer.

The following will describe a transfer operation of the conveyance device 10 configured as above. FIG. 4 is a front view illustrating the conveyance device 10 in a state in which the transfer mechanism 4 is being lowered during transfer. FIG. 5 is a side view illustrating the conveyance device 10 in a state in which the transfer mechanism 4 is being lowered during transfer. FIG. 6 is a front view illustrating the conveyance device 10 in a state in which the transfer mechanism 4 is rotating during transfer.

As illustrated in FIGS. 1 and 2, the conveyance device 10, in a conveying state, causes the frame 11 to accommodate the transfer mechanism 4. In addition, in the transfer mechanism 4, an upper chuck 41 grips a container 200, and a lower chuck 41 does not grip any container 200. The container 200 gripped by the upper chuck 41 accommodates an article that has not been processed by a device 300 illustrated in FIG. 6.

As illustrated in FIGS. 4 and 5, the conveyance device 10 stops travelling on arrival at a position above a transfer position at which the container 200 is to be transferred and then lowers the transfer mechanism 4 with use of the raising and lowering mechanism 2. In this state, in the transfer mechanism 4, the two chucks 41 are arranged one above the other.

When the transfer mechanism 4 is lowered to the transfer position, the raising and lowering mechanism 2 stops the lowering operation, and the lower chuck 41 grips a container 200 placed on the port 301. This container 200 accommodates an article that has been processed by the device 300. As illustrated in FIG. 6, the transfer mechanism 4 replaces the positions of the upper chuck 41 and the lower chuck 41 by causing the rotation arms 42a of the rotation mechanism 42 to rotate. When the upper chuck 41 moves to a lower position, the transfer mechanism 4 causes the chuck 41 which has been moved to the lower position to stop gripping the container 200, so that the container 200 which had been gripped by this chuck 41 is placed on the port 301.

When the containers 200 have been transferred as above, the raising and lowering mechanism 2 raises the transfer mechanism 4 to an accommodation position illustrated in FIGS. 1 and 2.

[Variation of Conveyance Device]

Figure 7:
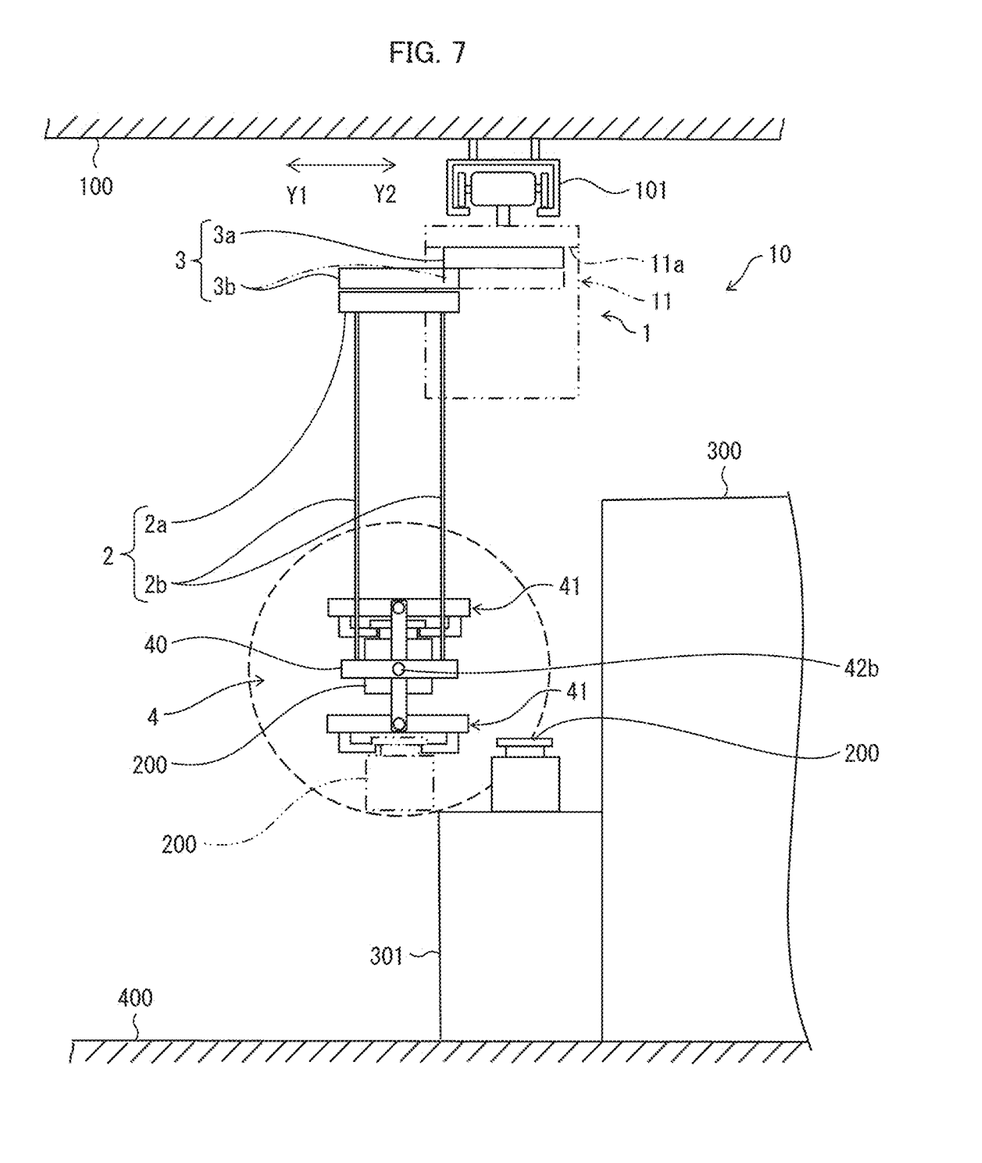
FIG. 7 is a side view illustrating the conveyance device in a state in which the transfer mechanism is performing transfer at a position to which the transfer mechanism has been moved in an orthogonal direction to a conveyance direction by a horizontal movement mechanism.

As described above, the rotation mechanism 42 drives the chucks 41 to rotate in a manner such that the chucks 41 revolve about the rotation center facing in the orthogonal direction. Alternatively, the rotation mechanism 42 may drive the chucks 41 to rotate in a manner such that the chucks 41 revolve about the rotation center facing in a conveyance direction. The following will describe such a configuration. FIG. 7 is a side view illustrating the conveyance device 10 in a state in which the transfer mechanism 4 is performing transfer at a position to which the transfer mechanism 4 has been moved in the orthogonal direction by a horizontal movement mechanism 3.

As illustrated in FIG. 7, the horizontal movement mechanism 3 includes a support mechanism 3a and a movable mechanism 3b.

The support mechanism 3a is fixed to a lower surface of the upper portion 11a of the frame 11. The support mechanism 3a includes, on a lower surface thereof, a slide rail which is not illustrated. The slide rail is linearly formed so as to have a longitudinal direction facing in the Y1 direction and the Y2 direction. Further, the slide rail is provided so that the slide rail can advance and retract in a Y1 direction or Y2 direction with respect to the lower surface of the support mechanism 3a.

The movable mechanism 3b is disposed on a lower end surface and advances and retracts in a Y1 direction or Y2 direction together with the slide rail. The movable mechanism 3b includes a mechanism that includes a motor, a pulley, a belt and the like and that converts a rotational motion into a linear motion. The movable mechanism 3b causes a force generated by such a linear motion in a Y1 direction or Y2 direction to be exerted on the slide rail. Note that the support mechanism 3a and the movable mechanism 3b are not limited to the above configurations but can employ a variety of configurations involving a horizontal movement.

In the transfer mechanism 4, the support shafts 42b are disposed so as to face in a conveyance direction, that is, a travel direction in which the carriage 1 travels.

The port 301 is disposed below the track 101. The device 300 is disposed so as to be adjacent to the port 301 on a Y2 direction side of the port 301.

In a case where the conveyance device 10 configured as above collects a container 200 placed on the port 301 and places, onto the port 301, a container 200 gripped by the conveyance device 10, the raising and lowering mechanism 2 first lowers the transfer mechanism 4. When the lower chuck 41 of the transfer mechanism 4 grips the container 200 placed on the port 301, the movable mechanism 3b of the horizontal movement mechanism 3 then moves, in the Y1 direction, to the position illustrated in FIG. 7.

Subsequently, the transfer mechanism 4 rotates in a state in which the lower chuck 41 grips the container 200. In this case, the transfer mechanism 4 rotates in a maximum rotation range as indicated by a broken line in FIG. 7. This rotation range is apart from the device 300. Thus, the transfer mechanism 4 can rotate without interfering with the device 300. Therefore, the positions of the upper chuck 41 and the lower chuck 41 can be replaced without a trouble. When the movable mechanism 3b of the horizontal movement mechanism 3 moves in the Y2 direction and returns to the original position, the raising and lowering mechanism 2 then raises the transfer mechanism 4.

[Another Variation of Conveyance Device]

In the conveyance device 10, the frame 11 may include a width increase/decrease mechanism that increases and decreases the width of the frame 11 in the conveyance direction so that the transfer mechanism 4 can rotate in a state in which the frame 11 accommodates the transfer mechanism 4. The width increase/decrease mechanism, with use of, for example, a mechanism such as the horizontal movement mechanism 3 or another known horizontal movement mechanism, causes two portions into which the frame 11 is separated at a center portion of the upper portion 11a to move in a width-increasing direction (the X1 direction and the X2 direction) or a width-decreasing direction (direction opposite to the width-increasing direction).

In a case where the transfer mechanism 4 rotates along the conveyance direction as illustrated in FIG. 1, and a plurality of ports 301 are disposed in proximity to each other along the conveyance direction, the rotation (as illustrated in FIG. 6) of the transfer mechanism 4 that has been lowered to a position near a target port 301 affects a transfer operation at an adjacent port 301. In order to avoid such inconvenience, the width of the frame 11 is increased, so that the transfer mechanism 4 can rotate in a state in which the frame 11 accommodates the transfer mechanism 4. This makes it possible to increase the number of the conveyance devices 10 that can exist in a predetermined range in a conveyance direction.

[Effect of Conveyance Device]

As described above, a conveyance device 10 according to Aspect 1 of the present invention includes: a carriage 1 configured to travel along a track 101; and a transfer mechanism 4 hung from the carriage 1 so as to be capable of being raised and lowered. The transfer mechanism 4 includes two chucks 41 that revolve about a rotation center provided in the transfer mechanism 4. In the present embodiment, the configuration in which the transfer mechanism 4 includes the two chucks 41 is described. However, the transfer mechanism 4 may include three or more chucks 41.

According to the above configuration, the rotation of the chucks 41 can replace the positions of the chucks 41. This makes it possible to dispose the chucks 41 at an upper position and a lower position. Therefore, it is possible to reduce a size of the conveyance device 10 in a direction in which the carriage 1 travels. This makes it possible to increase the number of the conveyance devices 10 that can be disposed in proximity to each other in the conveyance direction, compared with conventional devices.

In a conveyance device 10 according to Aspect 2 of the present invention, in addition to the configuration of Aspect 1, the transfer mechanism 4 includes: rotation arms 42a each having a plurality of end portions connected with the corresponding chucks 41; and supports 40 supporting the corresponding rotation arms 42a and provided with respective support shaft 42b constituting the rotation center.

According to the above configuration, the rotation arm 42a makes it possible to ensure a desired distance between the chucks 41. Thus, even when the rotation arm 42a rotates about the support shaft 42b in a state in which the chuck 41 grips a container 200 having a predetermined size, the rotation of the container 200 is not interrupted.

A conveyance device 10 according to Aspect 3 of the present invention, in addition to the configuration of Aspect 1 or 2, includes a control section 5 configured to carry out control so that the carriage 1 travels in a state in which, among the plurality of chucks 41 of the transfer mechanism 4, only one of the chucks 41 grips a container 200.

According to the above configuration, while one chuck 41 conveys a container 200, another chuck 41 that does not grip any container 200 can grip a container 200 to be conveyed. This makes it possible to, while a container 200 is conveyed to a destination, pick up another container 200 at the destination.

In a conveyance device 10 according to Aspect 4 of the present invention, in addition to the configuration of Aspect 3, the control section 5 is configured to carry out control so that the carriage 1 travels in a state in which the one of the chucks 41 holds, at an upper position, the container 200.

According to the above configuration, the chuck 41 that does not grip any container 200 can be disposed at a lower position. Thus, when, at a predetermined place, a lower chuck 41 grips a container 200 to be conveyed, and then the transfer mechanism 4 rotates, an upper chuck 41 moves downward and can drop off the container 200 that is gripped by the chuck 41 which has moved downward. Therefore, it is possible to efficiently pick up and drop off the container 200. In addition, the lower chuck 41 does not grip the container 200, so that the conveyance device 10 that is conveying the container 200 can be reduced in size in an up-and-down direction.

In a conveyance device 10 according to Aspect 5 of the present invention, in addition to the configuration of any one of Aspects 1 to 4, the support shaft 42b is disposed so as to face in a direction which is, in a horizontal plane, orthogonal to a travel direction in which the carriage 1 travels. This makes it possible to cause the chuck 41 to rotate along the conveyance direction. Therefore, in a case where an obstacle is present near the track 101, the chuck 41 that grips the container 200 can be caused to rotate without interfering with the obstacle.

In a conveyance device 10 according to Aspect 6 of the present invention, in addition to the configuration of any one of Aspects 1 to 4, the support shaft 42b is disposed so as to face in a travel direction in which the carriage 1 travels. This makes it possible to cause the chucks 41 to rotate in a manner such that the chucks 41 intersect with the conveyance direction. Therefore, in a case where an obstacle is present near the track 101, the chuck 41 that grips the container 200 can be caused to rotate without interfering with the obstacle.

A conveyance device 10 according to Aspect 7 of the present invention includes, in addition to the configuration of any one of Aspects 1 to 6, a horizontal movement mechanism 3 configured to cause the transfer mechanism 4 to move horizontally. Thus, in a case where an obstacle is present in a region in which the chuck 41 is caused to rotate, the transfer mechanism 4 that has moved with use of the horizontal movement mechanism 3 is caused to rotate, so that the chuck 41 that grips the container 200 can be caused to rotate without interfering with the obstacle.

Software Implementation Example

The control functions of the conveyance device 10 (hereinafter referred to as a "device") can be realized by a program for causing a computer to function as the device and for causing the computer to function as control blocks (in particular, functions of the control section 5) of the device.

In this case, the device includes, as hardware for executing the program, a computer which includes (i) at least one control device (e.g., processor) and (ii) at least one storage device (e.g., memory). By the control device and the storage device executing the program, the functions described in the above embodiments are realized.

The program may be stored in one or more non-transitory and computer-readable storage media. The one or more storage media may or may not be provided to the device. In the latter case, the program may be supplied to or made available to the device via any wired or wireless transmission medium.

Further, some or all of the functions of the control blocks can be realized by a logic circuit. For example, the present invention encompasses, in its scope, an integrated circuit in which a logic circuit that functions as each of the control blocks is formed.

Supplementary Note

The present invention is not limited to the embodiments above, but can be altered by a skilled person in the art within the scope of the claims. The present invention also encompasses, in its technical scope, any embodiment derived by combining technical means disclosed in differing embodiments.

REFERENCE SIGNS LIST

1 Carriage
2 Raising and lowering mechanism
3 Horizontal movement mechanism
4 Transfer mechanism (transfer section)
5 Control section
10 Conveyance device
40 Support (support part)
41 Chuck (gripping part)
42a Rotation arm (arm part)
42b Support shaft
101 Track
200 Container (conveyance target)

The invention claimed is:

1. A conveyance device comprising:
a carriage configured to travel along a track; and
a transfer section hung from the carriage so as to be capable of being raised and lowered,
the transfer section including
a plurality of gripping parts each of which is configured to revolve about a rotation center provided in the transfer section and grip a conveyance target,
arm parts each connected with the plurality of gripping parts, and
support parts supporting the corresponding arm parts and provided with respective support shafts constituting the rotation center,
the plurality of gripping parts being supported by the arm parts so as to be rotatable with respect to the arm parts.

2. The conveyance device according to claim 1, further comprising a control section configured to carry out control so that the carriage travels in a state in which, among the plurality of gripping parts of the transfer section, only one of the gripping parts grips the conveyance target.

3. The conveyance device according to claim 2, wherein the control section is configured to carry out control so that the carriage travels in a state in which the one of the gripping parts holds, at an upper position, the conveyance target.

4. The conveyance device according to claim 1, wherein the support shaft is disposed so as to face in a direction which is, in a horizontal plane, orthogonal to a travel direction in which the carriage travels.

5. The conveyance device according to claim 1, wherein the support shaft is disposed so as to face in a travel direction in which the carriage travels.

6. The conveyance device according to claim 1, further comprising a horizontal movement mechanism configured to cause the transfer section to move horizontally.

\* \* \* \* \*